US008355556B2

(12) United States Patent
Sussman et al.

(10) Patent No.: US 8,355,556 B2
(45) Date of Patent: Jan. 15, 2013

(54) METHOD OF SYNTHETIC IMAGE GENERATION FOR MAGNETIC RESONANCE IMAGING

(75) Inventors: Marshall Sussman, Toronto (CA); Lawrence M. White, Toronto (CA); Gustav Andreisek, Matzingen (CH); Norman Young, Toronto (CA)

(73) Assignee: University Health Network, Toronto, Ontario (CA)

( * ) Notice: Subject to any disclaimer, the term of this patent is extended or adjusted under 35 U.S.C. 154(b) by 162 days.

(21) Appl. No.: 12/947,256

(22) Filed: Nov. 16, 2010

(65) Prior Publication Data

US 2011/0280456 A1    Nov. 17, 2011

Related U.S. Application Data

(60) Provisional application No. 61/261,411, filed on Nov. 16, 2009.

(51) Int. Cl.
*G06K 9/00* (2006.01)
(52) U.S. Cl. ......................................... 382/131; 324/309
(58) Field of Classification Search ......................... None
See application file for complete search history.

(56) References Cited

U.S. PATENT DOCUMENTS

| 6,751,495 | B2 * | 6/2004 | Maier et al. | 600/410 |
| 7,081,750 | B1 * | 7/2006 | Zhang | 324/309 |
| 2001/0039377 | A1 * | 11/2001 | Maier et al. | 600/410 |
| 2004/0227514 | A1 * | 11/2004 | Jara | 324/310 |
| 2008/0108894 | A1 * | 5/2008 | Elgavish et al. | 600/420 |

OTHER PUBLICATIONS

Rauscher I, Stahl R, Cheng J, et al. Meniscal measurements of T1rho and T2 at MR imaging in healthy subjects and patients with osteoarthritis. Radiology 2008; 249:591-600.
Smith HE, Mosher TJ, Dardzinski BJ, et al. "Spatial variation in cartilage T2 of the knee". J Magn Reson Imaging 2001; 14:50-55.
Vidarsson L, Gold GE, Hargreaves B, Pauly JM. "Linear combination filtering for T2-selective imaging of the knee". Magn Reson Med 2006; 55:1191-1196.
Mosher TJ, Dardzinski BJ, Smith MB. "Human articular cartilage: influence of aging and early symptomatic degeneration on the spatial variation of T2—preliminary findings at 3 T. Radiology 2000"; 214:259-266.
Bottomley PA, Foster TH, Argersinger RE, Pfeifer LM. "A review of normal tissue hydrogen NMR relaxation times and relaxation mechanisms from 1-100 MHz: dependence on tissue type, NMR frequency, temperature, species, excision, and age". Med Phys 1984; 11:425-448.

(Continued)

*Primary Examiner* — Nancy Bitar
(74) *Attorney, Agent, or Firm* — Norton Rose Canada LLP

(57) ABSTRACT

A method, system and user interface for synthetic image generation for magnetic resonance (MR) imaging is described. A plurality of MR imaging data sets is received, each data set being acquired at a different value for a MR acquisition parameter. A response value for a particular property of tissues is determined, based on a calculated fit of each pixel to a property response model. A synthetic image is generated for a selected value of the MR acquisition parameter, based on the determined response value. An option is provided to dynamically change the selected value of the MR acquisition parameter and the synthetic image is re-generated for the changed value. An option may be provided to dynamically change the value. Another option may be provided to calculate a reliability measure for the synthetic image.

11 Claims, 11 Drawing Sheets b.

OTHER PUBLICATIONS

Bottomley PA, Hardy CJ, Argersinger RE, Allen-Moore G. "A review of 1H nuclear magnetic resonance relaxation in pathology: are T1 and T2 diagnostic?" Med Phys 1987; 14:1-37.

Riederer SJ, Suddarth SA, Bobman SA, Lee JN, Wang HZ, MacFall JR. "Automated MR image synthesis: feasibility studies". Radiology 1984; 153:203-206.

Riederer SJ, Lee JN, Farzaneh F, Wang HZ, Wright RC. "Magnetic resonance image synthesis. Clinical implementation". Acta Radiol Suppl 1986; 369:466-468.

Riederer SJ, Bobman SA, Lee JN, Farzaneh F, Wang HZ. "Improved precision in calculated T1 MR images using multiple spin-echo acquisition". J Comput Assist Tomogr 1986; 10:103-110.

Lee JN, Riederer SJ, Bobman SA, Johnson JP, Farzaneh F. "The precision of TR extrapolation in magnetic resonance image synthesis". Med Phys 1986; 13:170-176.

Lee JN, Riederer SJ, Bobman SA, Farzaneh F, Wang HZ. "Instrumentation for rapid MR image synthesis". Magn Reson Med 1986; 3:33-43.

Bobman SA, Riederer SJ, Lee JN, Tasciyan T, Farzaneh F, Wang HZ. "Pulse sequence extrapolation with MR image synthesis". Radiology 1986; 159:253-258.

Bobman SA, Riederer SJ, Lee JN, Suddarth SA, Wang HZ, MacFall JR. "Synthesized MR images: comparison with acquired images". Radiology 1985; 155:731-738.

Lee JN, Riederer SJ. "The contrast-to-noise in relaxation time, synthetic, and weighted-sum MR images". Magn Reson Med 1987; 5:13-22.

Kuhn MH, Menhardt W, Carlsen IC. "Real-time interactive NMR image synthesis". IEEE Trans Med Imaging 1985; 4:160-164.

Feinberg DA, Mills CM, Posin JP, et al. "Multiple spin-echo magnetic resonance imaging". Radiology 1985; 155:437-442.

Deoni SC, Rutt BK, Peters TM. "Synthetic T1-weighted brain image generation with incorporated coil intensity correction using DESPOT1. Magn Reson Imaging 2006"; 24:1241-1248.

White LM, Sussman MS, Hurtig M, Probyn L, Tomlinson G, Kandel R. "Cartilage T2 assessment: differentiation of normal hyaline cartilage and reparative tissue after arthroscopic cartilage repair in equine subjects". Radiology 2006; 241:407-414.

Gatehouse PD, He T, Puri BK, Thomas RD, Resnick D, Bydder GM. "Contrast-enhanced MRI of the menisci of the knee using ultrashort echo time (UTE) pulse sequences: imaging of the red and white zones". Br J Radiol 2004; 77:641-647.

Deoni SC, Rutt BK, Peters TM. "Rapid combined T1 and T2 mapping using gradient recalled acquisition in the steady state". Magn Reson Med 2003; 49:515-526.

Busse RF. "Reduced RF power without blurring: correcting for modulation of refocusing flip angle in FSE sequences". Magn Reson Med 2004; 51:1031-1037.

Schaefer DJ. "Dosimetry and effects of MR exposure to RF and switched magnetic fields". Ann N Y Acad Sci 1992; 649:225-236.

Gatehouse PD, Thomas RW, Robson MD, Hamilton G, Herlihy AH, Bydder GM. "Magnetic resonance imaging of the knee with ultrashort TE pulse sequences". Magn Reson Imaging 2004; 22:1061-1067.

MacFall JR, Riederer SJ, Wang HZ. "An analysis of noise propagation in computed T2, pseudodensity, and synthetic spin-echo images". Med Phys 1986; 13:285-292.

Peterfy CG, Guermazi A, Zaim S, et al. "Whole-Organ Magnetic Resonance Imaging Score (WORMS) of the knee in osteoarthritis". Osteoarthritis Cartilage 2004; 12:177-190.

Kundel HL, Polansky M. "Measurement of Observer Agreement. Radiology 2003"; 228:303-308.

Landis JR, Koch GG. "The measurement of observer agreement for categorical data". Biometrics 1977; 33:159-174.

Newcombe RG. "Two-sided confidence intervals for the single proportion: comparison of seven methods". Stat Med 1998; 17:857-872.

Fox MG. "MR imaging of the meniscus: review, current trends, and clinical implications". Radiologic Clinics of North America 2007; 45: 1033-1053.

Gatehouse PD, Bydder GM. "Magnetic resonance imaging of short T2 components in tissue". Clin Radiol 2003; 58:1-19.

Gold GE, Busse RF, Beehler C, et al. "Isotropic MRI of the knee with 3D fast spin-echo extended echo-train acquisition (XETA): initial experience". AJR Am J Roentgenol 2007; 188:1287-1293.

Schmid MR, Pfirrmann CW, Koch P, Zanetti M, Kuehn B, Hodler J. "Imaging of patellar cartilage with a 2D multiple-echo data image combination sequence". AJR Am J Roentgenol 2005; 184:1744-1748.

Buckwalter JA, Mankin HJ. "Articular cartilage: degeneration and osteoarthritis, repair, regeneration, and transplantation". Instr Course Lect 1998; 47:487-504.

Link TM, Stahl R, Woertler K. "Cartilage imaging: motivation, techniques, current and future significance". Eur Radiol 2007; 17:1135-1146.

Kleemann RU, Krocker D, Cedraro A, Tuischer J, Duda GN. "Altered cartilage mechanics and histology in knee osteoarthritis: relation to clinical assessment (ICRS Grade)". Osteoarthritis Cartilage 2005; 13:958-963.

Duc SR, Koch P, Schmid MR, Horger W, Hodler J, Pfirrmann CW. "Diagnosis of articular cartilage abnormalities of the knee: prospective clinical evaluation of a 3D water-excitation true FISP sequence". Radiology 2007; 243:475-482.

Duc SR, Pfirrmann CW, Schmid MR, et al. "Articular cartilage defects detected with 3D water-excitation true FISP: prospective comparison with sequences commonly used for knee imaging". Radiology 2007; 245:216-223.

Jungius KP, Schmid MR, Zanetti M, Hodler J, Koch P, Pfirrmann CW. "Cartilaginous defects of the femorotibial joint: accuracy of coronal short inversion time inversion-recovery MR sequence". Radiology 2006; 240:482-488.

* cited by examiner

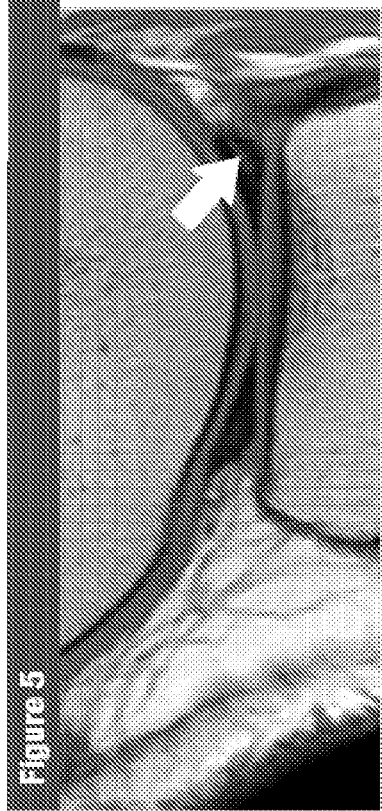
Figure 5

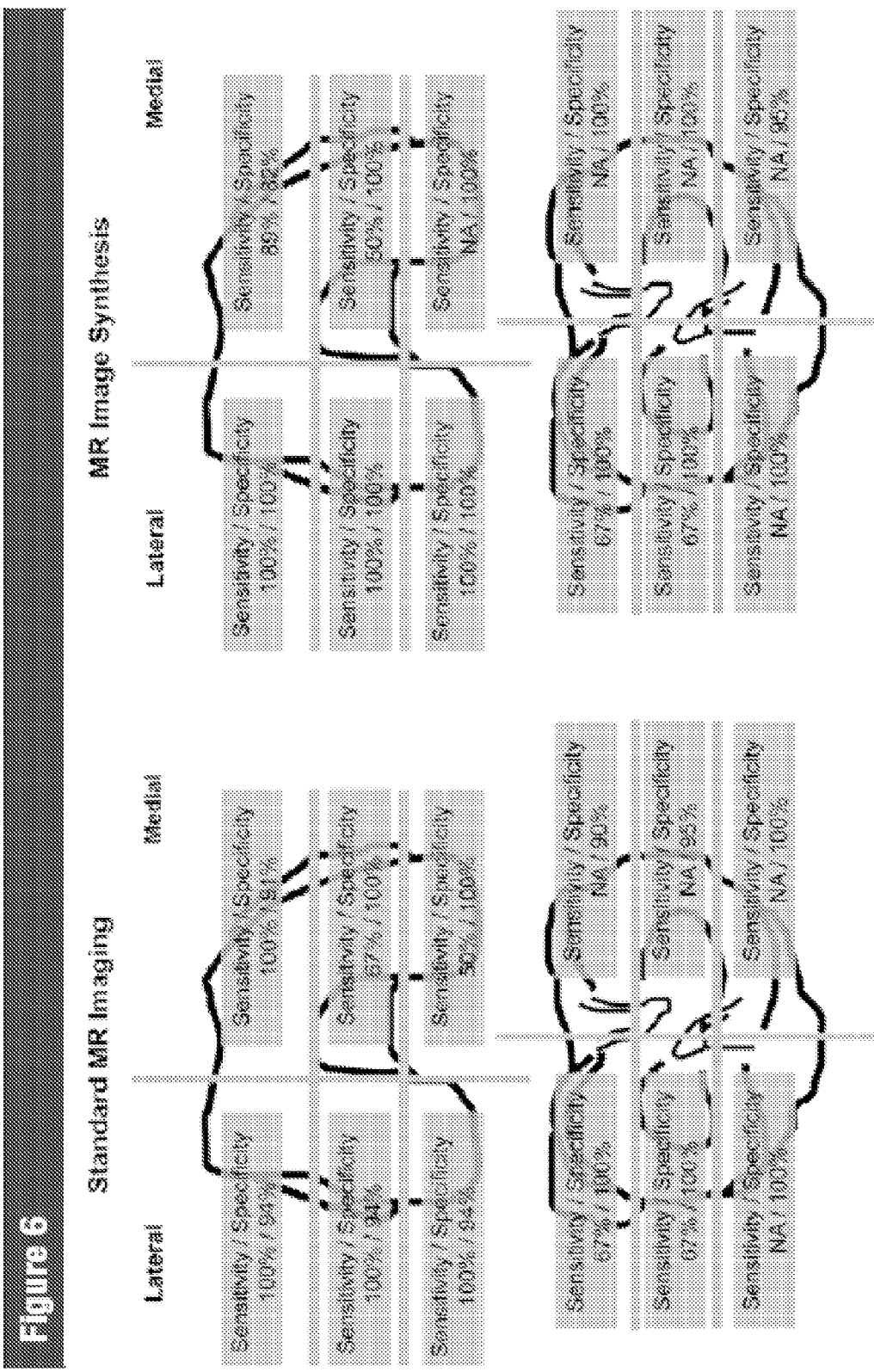

FIG. 7
Table 1.

| Sequence Parameters | MR Image Synthesis | Standard MR Imaging | |
|---|---|---|---|
| | T2*-weighted FGRE | T2-weighted FSE | Intermediate-weighted FSE |
| Dimension | 2D | 2D | 2D |
| Orientation | Sagittal | Sagittal | Sagittal |
| Repetition Time (TR) [ms] | 2000 | 3650-4200 | 2000 |
| Echo Time (TE) [ms] | Multi-echo [1] | 80-88 | 17 |
| No. of averages | 1 | 2 | 2 |
| Echo train length (ETL) | 1 | 10 | 8 |
| Field of view [mm] | 140 x 140 | 140 x 140 | 140 x 140 |
| Matrix size | 256 x 256 | 256 x 224 | 288 x 256 |
| Pixel size [mm] | 0.6 x 0.6 | 0.6 x 0.6 | 0.5 x 0.6 |
| Slice thickness [mm] | 4 | 4 | 4 |
| Interslice gap [mm] | 0 | 0 | 0 |
| Number of slices | 26 | 26 | 26 |
| Flip angle | 90 | 90 | 90 |
| Fat suppression | Yes [1] | Yes | No |
| Bandwith [kHz] | 91 | 25 | 42 |
| Imaging time [min] | 7:08 | 5:51 | 4:25 |

Note. – FGRE = Fast Gradient Recalled Echo; FSE = Fast Spin Echo. The multi-echo FGRE sequences included signal acquisitions at echo times of 6.7, 8.6, 10.4, 12.2, 14.1, 15.9, 17.8, and 19.6 ms. [1] = water excitation FIG. 8
Table 2.

| Anatomic Structures | Inter-method Agreement | 95% Confidence Interval | | P-value |
|---|---|---|---|---|
| | | Lower Bound | Upper Bound | |
| Medial and lateral menisci | | | | |
| Subregions | 0.94 | 0.92 | 0.96 | < 0.001 |
| Overall | 0.90 | 0.83 | 0.94 | < 0.001 |
| Cartilage | 0.80 | 0.75 | 0.84 | < 0.001 |
| Cruciate Ligaments | 1.0 | 1.0 | 1.0 | < 0.001 |
| Overall | 0.86 | 0.83 | 0.88 | < 0.001 |

Note. – Data are intraclass correlation coefficients (ICC values) and 95% confidence intervals of ICC. P-values were calculated using t-tests and indicate statistical significance of ICCs being different from zero ($\alpha$ <0.05).

FIG. 9
Table 3.

| Anatomic Structures | Agreement | 95% Confidence Interval | | P-value |
|---|---|---|---|---|
| | | Lower Bound | Upper Bound | |
| Standard MR imaging versus surgery | | | | |
| Medial meniscus | | | | |
| Subregions | 0.86 | 0.77 | 0.92 | < 0.001 |
| Overall | 0.95 | 0.88 | 0.98 | < 0.001 |
| Lateral meniscus | | | | |
| Subregions | 0.93 | 0.88 | 0.96 | < 0.001 |
| Overall | 0.97 | 0.94 | 0.99 | < 0.001 |
| Cartilage | 0.79 | 0.73 | 0.84 | < 0.001 |
| Cruciate Ligaments | 1.0 | 1.0 | 1.0 | < 0.001 |
| Synthetic-TE technique versus surgery | | | | |
| Medial meniscus | | | | |
| Subregions medial | 0.86 | 0.76 | 0.91 | < 0.001 |
| Overall medial | 0.87 | 0.67 | 0.95 | < 0.001 |
| Lateral meniscus | | | | |
| Subregions lateral | 0.94 | 0.90 | 0.96 | < 0.001 |
| Overall lateral | 0.96 | 0.87 | 0.98 | < 0.001 |
| Cartilage | 0.80 | 0.74 | 0.85 | < 0.001 |
| Cruciate Ligaments | 1.0 | 1.0 | 1.0 | < 0.001 |

Note. – Data are intraclass correlation coefficients (ICC values) and 95% confidence intervals of ICC. P-values were calculated using t-tests and indicate statistical significance of ICCs being different from zero ($\alpha < 0.05$).

FIG. 10

Table 4.

| Anatomic Structures | True-positive Findings | True-Negative Findings | False-Positive Findings | False-Negative Findings | Sensitivity [1,2] | Specificity [1,2] | Positive Predictive Value [1,2] | Negative Predictive Value [1,2] | Accuracy [1,2] |
|---|---|---|---|---|---|---|---|---|---|
| Standard MR imaging | | | | | | | | | |
| Medial meniscus | | | | | | | | | |
| Subregions | 22 | 33 | 1 | 4 | 85 (69,100) | 97 (90,100) | 96 (85,100) | 89 (78,100) | 92 (84,99) |
| Overall | 12 | 7 | 1 | 0 | 100 (96,100) | 88 (58,100) | 92 (74,100) | 100 (93,100) | 95 (83,100) |
| Lateral meniscus | | | | | | | | | |
| Subregions | 10 | 46 | 3 | 1 | 91 (69,100) | 94 (86,100) | 77 (50,100) | 98 (93,100) | 93 (86,100) |
| Overall | 5 | 14 | 1 | 0 | 100 (90,100) | 93 (77,100) | 83 (45,100) | 100 (96,100) | 95 (83,100) |
| Cartilage | 27 | 200 | 7 | 6 | 82 (67,96) | 97 (94,99) | 79 (64,94) | 97 (95,100) | 95 (92,98) |
| Synthetic-TE technique | | | | | | | | | |
| Medial meniscus | | | | | | | | | |
| Subregions | 22 | 33 | 1 | 4 | 85 (69,100) | 97 (90,100) | 96 (85,100) | 89 (78,100) | 92 (84,99) |
| Overall | 11 | 7 | 1 | 1 | 92 (72,100) | 88 (58,100) | 92 (72,100) | 88 (58,100) | 90 (74,100) |
| Lateral meniscus | | | | | | | | | |
| Subregions | 10 | 47 | 2 | 1 | 91 (69,100) | 96 (89,100) | 83 (58,100) | 98 (93,100) | 95 (89,100) |
| Overall | 5 | 13 | 2 | 0 | 100 (90,100) | 87 (66,100) | 71 (31,100) | 100 (96,100) | 90 (74,100) |
| Cartilage | 23 | 204 | 3 | 10 | 70 (53,87) | 99 (97,100) | 88 (74,100) | 95 (92,98) | 95 (92,98) |
| Sign test (α = 0.05) | | | | | 0.5 | 1.0 | 1.0 | 0.5 | 1.0 |

Note.—Numbers are raw data, unless otherwise indicated. [1] Numbers are percentages. [2] Numbers in parentheses are 95% confidence intervals (lower bound, upper bound).

METHOD OF SYNTHETIC IMAGE GENERATION FOR MAGNETIC RESONANCE IMAGING

TECHNICAL FIELD

The present disclosure relates generally to a method of image generation for magnetic resonance imaging. In particular, the present disclosure relates generally to a method, system and user interface of synthetic image generation.

BACKGROUND

In routine spin-echo or fast spin echo (FSE) magnetic resonance (MR) imaging, tissue contrast is governed by the echo time (TE). By an appropriate choice of TE, the contrast between native tissue and pathology may in theory be optimized. This optimization is typically governed by the relative T2 values of the two species. In practice, a range of T2 values may be present in both native tissue and pathology (references 1, 2). Moreover, multiple tissue types as well as multiple pathologies, all with potentially different T2 values, may be present (references 3-6). As a consequence, any single TE is likely suboptimal for the visualization of at least some of the tissue/pathology. Additional scans at different TEs may need to be performed. However, time constraints limit the number of TEs that may be acquired. More importantly, the T2 values present, and therefore the optimal TEs, are not necessarily known a priori.

In theory, a post-acquisition technique which would allow a user to selectively vary the imaging TE dynamically through a range of TE values, analogous to "windowing and leveling" the grey-scale image display range of digital acquisitions, could provide a new means of diagnostic interpretation of clinical musculoskeletal MR imaging. Such a technique could allow for interpretation of images at any selected TE, but would also allow for visual evaluation of the dynamic variation of T2 contrast within tissues by continuous real-time user variation of the image TE settings.

An imaging strategy to accomplish this is to first generate a T2 map of the anatomy. This provides quantitative T2 and proton density (PD) values for every pixel in the image. Using a model for TE decay, for example a mono-exponential model, a synthetic image $I_{syn}(x,y)$ at any TE value (i.e. from 0 to infinity) comprised of pixels at location (x,y) may then be generated via the following formula (here, using a mono-exponential model):

$$I_{syn}(x,y)=PD(x,y)\cdot e^{-TE/T2(x,y)} \quad \text{(equation 1)}$$

The principles of this synthetic-TE technique were first described in 1984 (reference 7). However, early implementations of this approach were limited by hardware constraints, as well as inadequate tools for proper radiological analysis of the synthetic-TE images (references 7-17).

There drawbacks with existing synthetic-TE approaches (references 7-13, 17). One is lack of appropriate software for a proper, formal radiological analysis of the synthetic-TE images. This limited the effectiveness, and the ultimate utility of early synthetic TE techniques. Another drawback is that existing techniques do not provide any indication as to how reliably the "synthetic" images represent the underlying "true" anatomy. For example, the synthetic image may be considered unreliable if the decay model used to generate the synthetic image has a poor-quality fit with the actual MR signal behavior. For example, one key assumption of previous synthetic-TE techniques is that the T2-decay data is described accurately by a mono-exponential decay model. In reality, the possibility of deviation from this model is not negligible, as many factors are known to affect the nature of T2 decay (e.g. diffusion, exchange between tissue compartments, the presence of more than one T2 species within a pixel, etc). If the MR signal is not described accurately by a mono-exponential decay model, then the synthesized-TE images will provide unreliable information. Existing synthetic-TE approaches have no means of assessing the presence of this possible unreliability.

These drawbacks and other limitations of existing synthetic-TE approaches have impeded the use of synthetic-TE techniques on a routine basis.

SUMMARY

In some aspects of the present disclosure, there is provided a method of synthetic image generation for magnetic resonance (MR) imaging, the method comprising: receiving a plurality of MR imaging data sets, each data set comprising a set of pixel values acquired at a different value for at least one MR acquisition parameter; determining a response value for a particular property of tissues for each pixel, based on a calculated fit of each pixel to a property response model; generating a synthetic image for a selected value of the at least one MR acquisition parameter, based on the determined response value for each pixel; and providing an option to dynamically change the selected value of the at least one MR acquisition parameter and, in response to any change in the selected value of the at least one MR acquisition parameter, re-generating the synthetic image.

The method may also include: providing an option to select a quality threshold for the synthetic image; determining any pixel in the synthetic image that fails to meet the quality threshold; and indicating the determined pixels that fail to meet the quality threshold.

In some aspects of the present disclosure, there is also provided a graphical user interface (GUI) and a system suitable for carrying out the method described above.

BRIEF DESCRIPTION OF THE DRAWINGS

Reference will now be made to the drawings, which show by way of example embodiments of the present disclosure, and in which:

FIG. 2 shows an example of a user interface for a method of synthetic image generation, in accordance with an example embodiment of the present disclosure;

FIG. 5 shows example generated synthetic-TE images, in accordance with an example embodiment of the present disclosure;

FIG. 6 shows a chart comparing the sensitivity and specificity of the synthetic-TE method compared to standard MR imaging, in an example embodiment of the present disclosure;

FIG. 7 shows Table 1, which shows parameters for standard MR imaging and synthetic-TE image generation, in an example embodiment of the present disclosure;

FIG. 8 shows Table 2, which shows the agreement between standard MR imaging and synthetic-TE image generation, in an example embodiment of the present disclosure;

FIG. 9 shows Table 3, which shows the agreement between standard MR imaging and synthetic-TE image generation, and surgery, in an example embodiment of the present disclosure; and FIG. 10 shows Table 4, which shows a comparison of diagnostic performance between standard MR imaging and synthetic-TE image generation, in an example embodiment of the present disclosure.

DETAILED DESCRIPTION

Figure 1A:
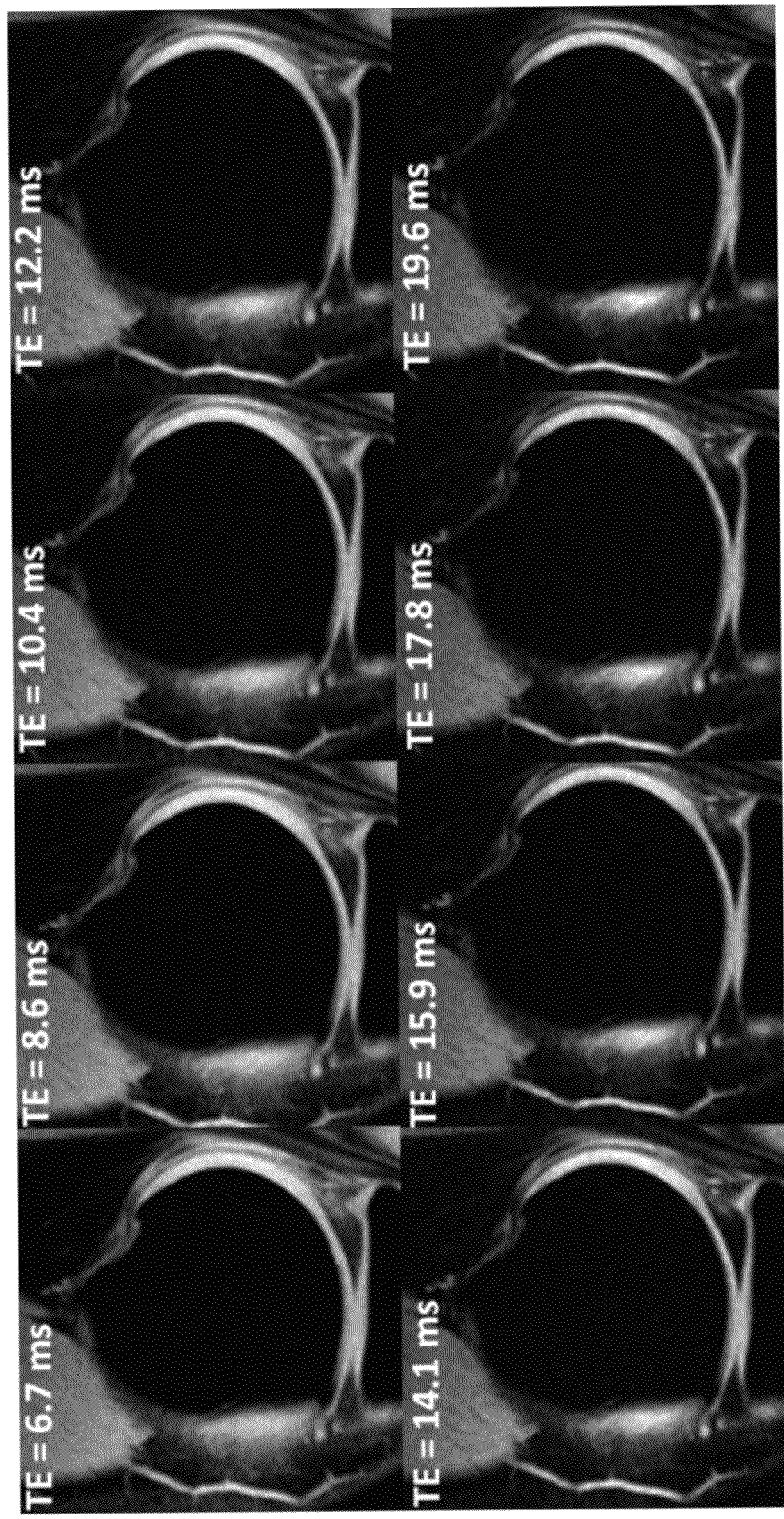
FIGS. 1a and 1b show a series of MR images at different TE values, and a fit of a pixel to a decay model.

In the present disclosure, a method of synthetic image generation for MR imaging is described, as well as a system and a user interface suitable for the method. In MR imaging, the image that is acquired may be dependent on certain MR acquisition parameters, including, but not limited to, for example, TE, inversion time (TI), gradient time, gradient strength, and b-value. A synthetic image may be generated for selected value of MR acquisition parameter, simulating the image that would be acquired at that value of the MR acquisition parameter. A synthetic image may be generated based on calculations of a characteristic response value for a particular property of the tissues. For example, different tissues have properties that respond differently to different TEs, and this results in different characteristic T2 decays for different tissues, which may be used for generation of synthetic-TE image. Other response values for other tissue properties may include, for example, T1 values and diffusion values. Calculations of a response value may be made using a property response model. For example, the T2 value of a tissue is a decay constant that is characteristic of that tissue's response during MR acquisition, and the T2 value may be calculated based on a decay model. Other response values may use other response models, including, for example, a recovery model.

In some examples, the MR acquisition parameter of interest is TE and the characteristic response value for a particular property of the tissues is the T2 value. The present disclosure includes a description of an example synthetic-TE approach along with a system and user interface that implements synthetic-TE generation into a MR image processing system, such as a picture archiving and communication system (PACS). The user interface provides the user with the option to vary the synthesized image interactively and dynamically, in real-time, for example by simple mouse navigation (similar to window and level adjustments) or other conventional input methods, including the use of other input devices. The disclosed method, system and user interface may provide for the routine use of synthetic-TE techniques in MR imaging. In some example embodiments, the method, system and user interface also provides the user with an option to assess the reliability of the mathematically-generated data contained within the synthetic images. The disclosed method, system and user interface may provide a user with a continuum of synthetic images generated for any TE value from 0 ms to infinity, allowing the user to dynamically vary the TE for which a synthetic image is generated, thus helping to facilitate the use of synthetic images on a routine basis.

This disclosure also describes an example use of the method and system in an example study that demonstrates the feasibility of applying a synthetic-TE analysis approach, in this instance for the diagnostic evaluation of the knee. As a means of assessing the feasibility of the technique, the diagnostic accuracy of the synthetic-TE technique in the assessment of the menisci and articular cartilage of the knee was evaluated, and the accuracy was compared to conventional intermediate-weighted and T2-weighted acquisitions of the joint.

Example embodiments of the method, system and user interface for synthetic image generation for MR imaging is now described. Although specific examples and details are described, these are for the purpose of illustration only and are not intended to be limiting.

EXAMPLE

In this example, the generation of synthetic-TE images is described. In this example, the MR acquisition parameter that is selectable for the synthetic image is the TE value. In this example, T2 and PD are the response values for the particular tissue property used to generate synthetic-TE images. In this example, the T2 and PD values may be calculated using a decay model as the response model.

For the synthetic-TE technique, T2 and PD values for every pixel in the image must be supplied. Such information is readily available from a wide variety of well-known techniques (e.g., see reference 17). A series of MR images are acquired, for example using a conventional MR scanner. Each acquired image is at a different TE. An example of such a series of images is shown in FIG. 1a). In some examples, at least four images, each at a different TE, are acquired. Typically, the greater the number of images at different TE values, the more reliable the calculations for the synthetic image. In some examples, the number of images acquired range from about 4 to about 10.

In some examples, the MR data for the images are sent to a MR data processing system, such as a computer workstation having MR imaging software. In some examples the MR data processing system is part of the conventional MR scanner, rather than a separate workstation. In some examples, generation of the synthetic image may be performed separately from conventional MR data processing, and may be performed in a system separate from that used for conventional MR data processing. The MR data is processed using MR data techniques to produce an MR image. In an aspect of the present disclosure, a user interface is provided, for example as additional software on the system or integrated into existing MR imaging software, to facilitate synthetic image generation. In some examples, the user interface for synthetic image generation may be integrated into a conventional PACS. In the example shown in FIG. 2, the user interface is a graphical user interface (GUI) provided as a plug-in to existing imaging software, in this example a pre-existing open-source PACS image viewer (ClearCanvas Workstation 0.9, ClearCanvas Inc., Toronto, ON). In some examples, the user interface may be provided in the MR scanner itself.

In FIG. 2, the example plug-ins are indicated by circles. As shown, the example GUI provides the user the option of viewing standard MR images (in this example, the left hand side image is a standard T2-weighted fast spin echo (FSE) MR image (TR/TE, 4067/88 ms) as well as the viewing of synthesized images generated with a synthetic-TE technique, described below, using T2-maps (in this example, shown on the right hand side).

Figure 1B:
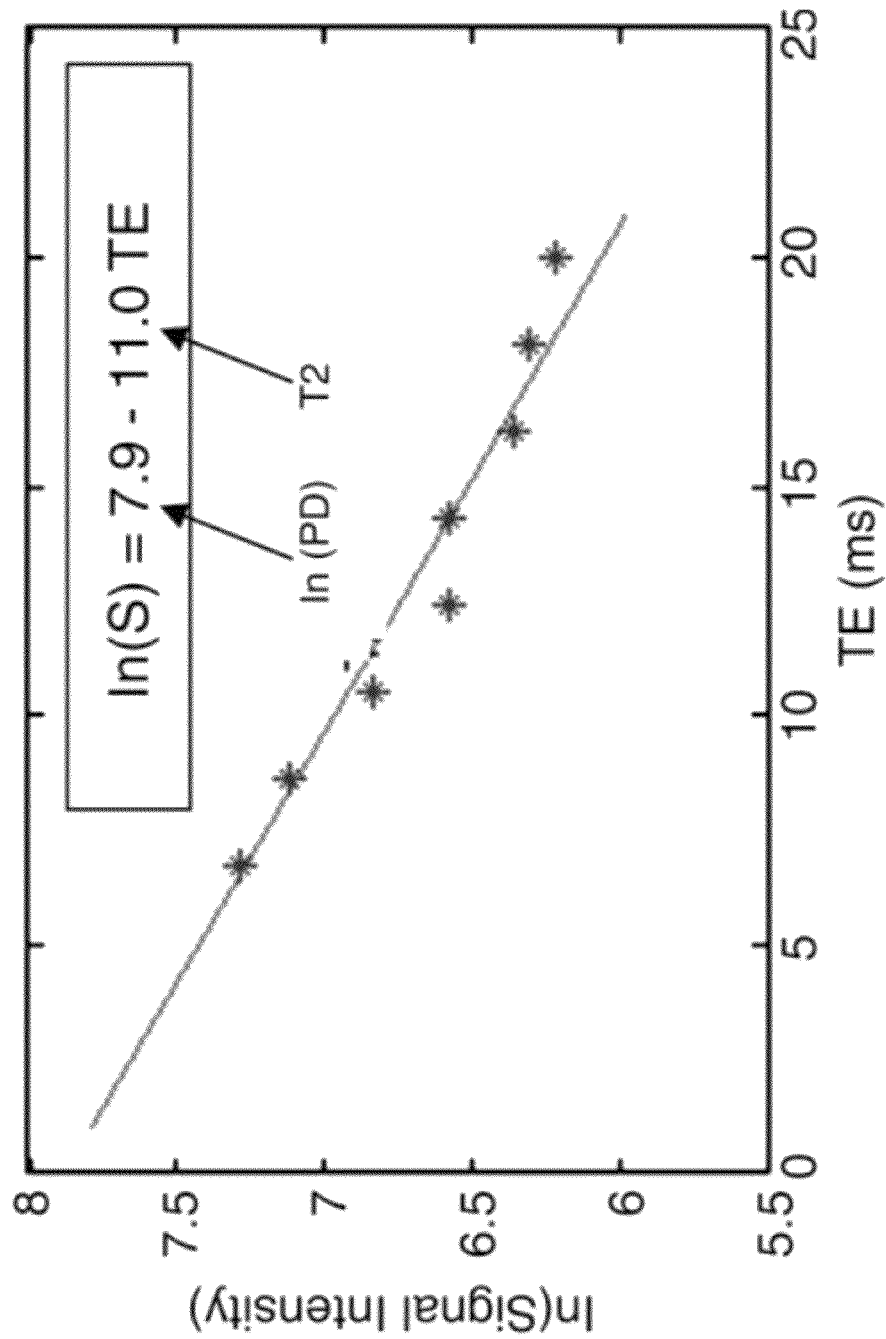

As a result of T2 decay, the intensity of each pixel in the image will decrease as the TE increases. A model is used to predict this decrease. In this example, a mono-exponential model is used to predict the form of the intensity decrease over time. The rate of mono-exponential decay is governed by the T2 value, which in general may vary from one tissue to the next. A mono-exponential decay curve (for example, $e^{-TE/T2}$), is fitted to every pixel in the image. Note that what the fitting procedure actually does is find the optimal T2 value such that the exponential decay model will best fit the data. An example of this fit for one pixel is illustrated in FIG. 1b). In some examples, the user interface may include the ability to perform this fit calculation, for example as part of the example plug-in and GUI of FIG. 2.

After a fit for every pixel in the image is completed, the T2 value associated with every pixel in the image will have been determined. As part of the fitting procedure, the PD value is also determined. Using this information, the image intensity of a pixel at location (x,y) can be synthesized, for example using equation (1) described above.

Figure 3:
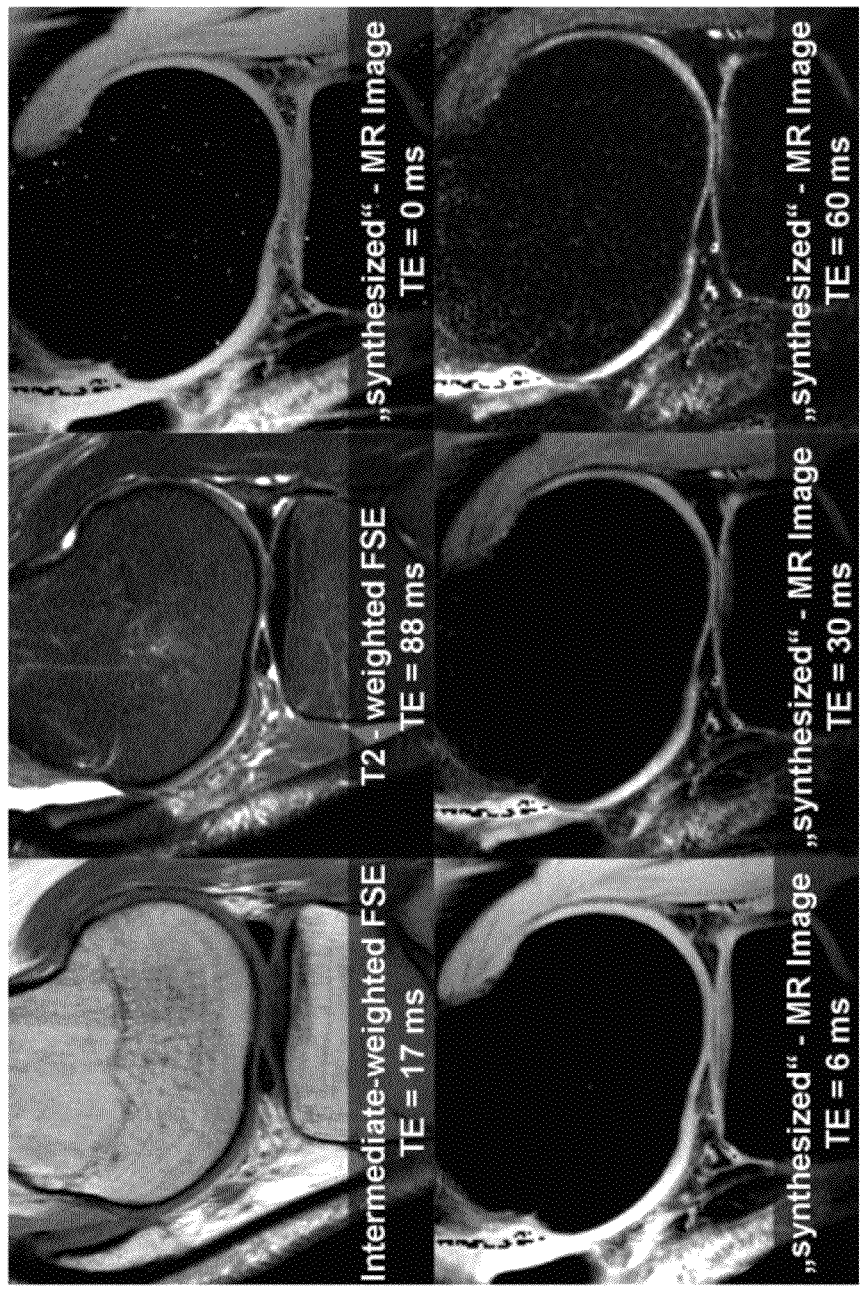
FIG. 3 shows a series of example images generated using a method of image generation, in accordance with an example embodiment of the present disclosure.

Using this method, every pixel in the image can be synthesized for any selected TE. As a result, a computer-generated image may be synthesized for any TE from 0 ms to infinity. FIG. 3 illustrates an example of a number of different synthesized images at various TEs. The example GUI described here provides the user with the option to vary the TE interactively and dynamically, for example through navigation with a mouse or other input device. The synthetic image may be generated dynamically, using "on-the-fly" calculations, in response to a selection or a change in selection of the TE.

In this example, the GUI is integrated into a conventional PACS system, and this interactive variation of TE within the framework of a PACS system may be an intuitive extension of the windowing/leveling operations that are used pervasively throughout conventional radiologic practice. Although the present example has been described in the context of the ClearCanvas software environment, this same approach may be applied to any other suitable image viewing system. The user interface described may be adaptable to be integrated into the software environment of any other suitable image viewing system, or may be provided as separate additional software for any image viewing system.

Although the examples have been described with reference to a mono-exponential model of T2 decay, other decay models may be used, including multi-exponential models. In some examples, the decay model used may be selectable, such as by selecting an option provided in the user interface. Although the method and system have been described with reference to synthetic images generated from T2 values, using a T2-based equation, the method and system may be extended to include synthetic images generated from other (i.e. non-T2) and/or additional forms of contrast in MR imaging (see, for example, references 7, 17).

For example, synthetic-TI images may be generated from T1-mapping data. In another example, synthetic images may be generated where both TE and TI can be dynamically varied. Such modifications may require different or additional image data to be acquired, for example both T1- and T2-mapping data. The disclosed method, system and user interface may be useful in various applications including, for example, meniscal assessment, cartilage assessment, and assessing delayed enhancement cardiac images.

In some examples, the type of synthetic image generated may be selectable, such as by selecting an option provided in the user interface. In some examples, such as where the acquired images are multi-parameter data sets (e.g., includes coded data for both T1 and T2 values), different types of synthetic images may be generated using the same acquired data set.

Quality Measure

The generation of a synthetic image may be based on fitting acquired MR data to a response model. However, the data may deviate from a given response model, which may result in less reliable synthetic images.

For example, in the case of the synthetic-TE technique described above, optionally, the accuracy of the assumed fit for the T2 decay may be determined for each pixel, using statistical analysis techniques. This may be useful because the MR behaviour may not follow the assumed model, in this example a mono-exponential decay model, in which case the model will not fit the data well.

For example, an assumption of the synthesized-TE technique is that the T2-decay data is described accurately by a decay model, such as a mono-exponential decay model in the example described here. If this is not the case, then the synthesized-TE images may provide unreliable information. For example, factors such as diffusion, exchange between tissue compartments, the presence of more than one T2 species within a pixel, etc., may affect how well the decay model fits the data. Other factures, such as magnetic field inhomogeneities in the case where a gradient echo acquisition was utilized to acquire the decay data, could also give rise to additional deviations from the assumed decay model.

To take this factor into account, in some embodiments of the present disclosure, a $\chi^2$ calculation is additionally included, to assess the quality of every fit to the decay model. To determine the accuracy of the fit, for every curve fit that is performed on a pixel, a $\chi^2$ value may be calculated as follows (in this example, for a mono-exponential model):

$$\chi^2(x, y) = \frac{\sum_{i=1}^{N} [I(x, y, TE_i) - e^{-TE_i/T_2(x,y)}]^2}{\sigma^2} \quad \text{(equation 2)}$$

where $I(x,y,TE_i)$ is the pixel value of the synthetic image at pixel located at (x,y), generated using TE value equal to $TE_i$ (e.g., as calculated using equation 1 above), and where σ is the noise. The larger the deviation of the data from mono-exponentiality, the larger the $\chi^2$ value. Any pixel having a $\chi^2$ value above a certain threshold (which may be selected by the user or may be pre-set and fixed in the system) may thus be determined to be unreliable or of questionable accuracy. To implement this, the user interface may additionally provide the user with an option to set a $\chi^2$ value threshold. The $\chi^2$ value threshold may be pre-set by the user or may be dynamically changed when viewing a synthetic-TE image. Pixels with $\chi^2$ values larger than the selected $\chi^2$ value threshold may be rejected as not following the assumed model. These pixels may be shown with a red colour overlay over the generated synthetic-TE image. This may allow the user to assess the reliability of the synthesized data presented. As with the TE value, the $\chi^2$ value threshold may be varied interactively and dynamically, for example through navigation with a mouse or other input device, to allow the user to set various tolerance levels for accepting/rejecting fit to the assumed model.

Figure 4:
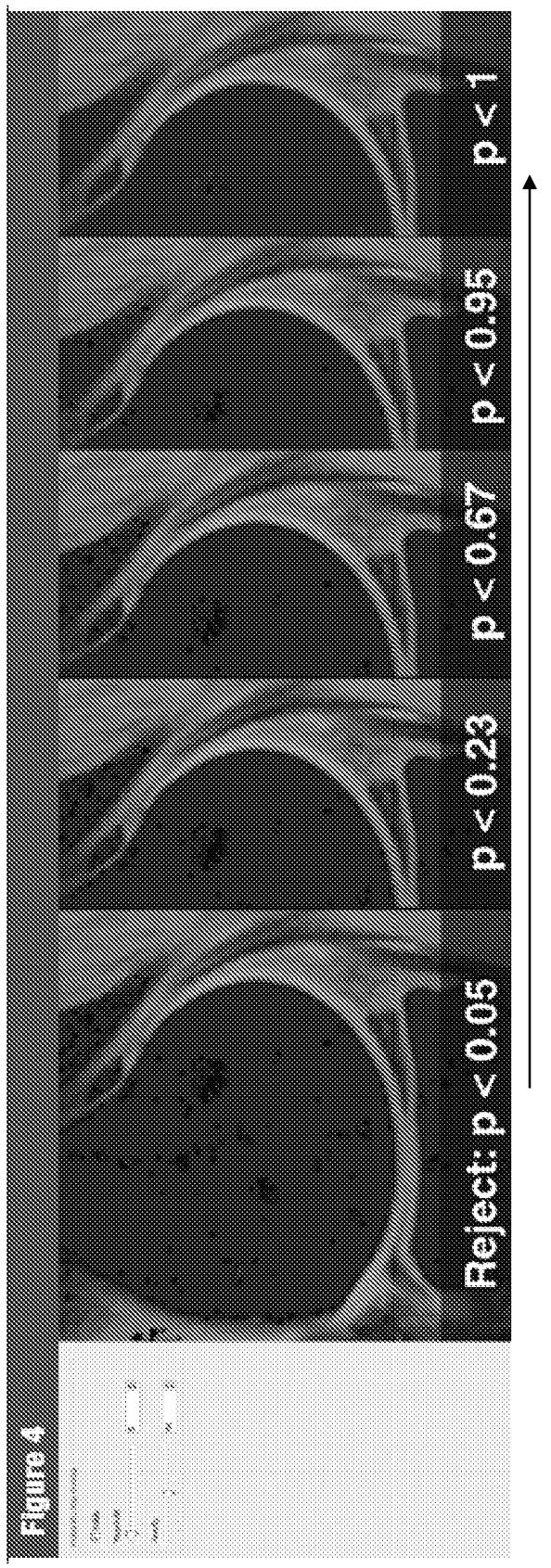
FIG. 4 shows a series of example images showing the application of a p-value threshold, in accordance with an example embodiment of the present disclosure.

Additionally or alternatively, a p-value threshold may be used to assess the quality of fit to the decay model. In general, the probability that a given $\chi^2$ value was caused by random noise alone (i.e. the p-value) may be calculated. If a pixel's p-value is less than a certain p-value threshold, it implies that noise alone is not responsible for observed deviations from the decay model fit. Under these circumstances, the fit is determined to not match the decay model at the certain p-value threshold level of significance. Any pixel with a p-value less the certain threshold (which may be selected by the user or may be pre-set and fixed in the system) may thus be determined to be unreliable or of questionable accuracy. To implement this, the user interface may additionally provide the user with an option to set a p-value threshold. Pixels with p-values smaller than the selected p-value threshold may be rejected as not following the assumed decay model. Such pixels may be shown with a red colour overlay over the generated synthetic-TE image, for example as shown in FIG. 4, similar to the assessment based on $\chi^2$ value. This may allow the user to assess the reliability of the synthesized data presented. As with the $\chi^2$ value, the p-value threshold may be pre-set by the user or may be varied interactively and dynamically while viewing the synthetic-TE image, for example through navigation with a mouse or other input device, to allow the user to set various tolerance levels for accepting/rejecting fit to the assumed model.

This may permit the user to subjectively interpret the reliability of the information depicted in the image, allowing the user to incorporate his experience and judgment into the ultimate clinical decision. A similar approach could also be taken with reliability measures other than the $\chi^2$ value or the p-value. Other methods of displaying the calculated reliability measure may be used, in addition to or alternative to the overlay described above. For example, the calculated reliability measure may be displayed numerically, as a graph, or any other suitable methods.

Example Study

In an example study, the method for synthetic image generation, using a synthetic-TE MR post-processing technique, was evaluated against standard MR imaging, in the context of meniscal and cartilage abnormalities of the knee.

MR Imaging

MR imaging was performed using a 1.5T MR scanner (Signa Excite HD, GE Healthcare, Waukesha, Wis.) and an 8-channel knee coil (Invivo Corp., Orlando, Fla.). Conventional MR imaging as well as a T2 map acquisition (used for synthetic-TE image generation) was performed on all subjects at the same locations with the same slice thickness. Conventional MR imaging included sagittal fast spin echo (FSE) sequences as per standard knee MR imaging protocols (see Table 1 in FIG. 7). This consisted of a short TE (17 ms) and a long TE (~80 ms) acquisition. Total acquisition time was 10:16 minutes. For efficient T2 mapping, a multi-echo spin echo sequence is typically used (reference 18). However, due to the short T2 value of menisci (<10 ms), very short echo times are required (reference 19). This is typically difficult to achieve for spin-echo-based pulse sequences due to hardware limitations and specific absorption rate (SAR) constraints (references 20-22). Therefore, a T2*-weighted multi-echo fast gradient recalled echo (FGRE) pulse sequence was used. This provided echo times of 6.7, 8.6, 10.4, 12.2, 14.1, 15.9, 17.8, and 19.6 ms with minimal heat deposition (specific absorption rate (SAR): $9.5 \times 10^{-4}$ W/kg per each single acquisition). Total acquisition time was 7:08 minutes. Technically, FGRE provides T2*-weighted, rather than T2-weighted, images. However because the T2 values of knee menisci are so short, it may be assumed that any non-T2 contributions to the signal decay (e.g. $B_0$ inhomogeneities, susceptibility effects, etc.) are minimal, and that consequently T2≈T2*. Previously reported meniscal T2 (reference 23) and T2* (reference 1) values support this assumption. Note, however, that this assumption may not strictly hold for cartilage, which has longer T2 values (~30-60 ms) (reference 18). Therefore, the cartilage data may be more correctly described as T2*-weighted. For the purposes of simplicity, however, all data will be referred to as T2-weighted in this example. The pulse sequence employed a water-only RF excitation pulse. This eliminates any fat signal which could corrupt the data analysis in pixels that contain mixtures of fat and water.

Synthetic Image Generation

For synthetic image generation, in this example generation of a synthetic-TE image, a decay model, in this example a mono-exponential least-squares fit (reference 24), was first applied to every pixel in the multi-echo data set. FIG. 1a) shows a series of sagittal MR images of the knee of a 54 year old male subject acquired using a T2*-weighted two-dimensional multi-echo, water-excitation, fast gradient recalled echo (FGRE) MR sequence (repetition time (TR), 2000 ms) at eight different TEs. FIG. 1b) shows an example curve fit of T2 data from a single pixel, using data acquired at the different TEs used to generate the proton density (PD) and T2 values, for generation of the synthetic-TE image. This example data corresponded from a pixel in the meniscus.

These fits provided a T2 and PD value for every pixel in the image. This information was then processed using the user interface, for example provided in the form of the plug-in described above, with reference to FIG. 2, where synthetic-TE images were generated using equation 1, described above.

An example of synthetic-TE images generated using dynamically-varied TE values is shown in FIG. 3. FIG. 3 shows a series of sagittal MR images of the knee of a 35 year old male subject. The figure shows standard intermediate-weighted (TR, 2000 ms; TE, 17 ms) (upper left) and fat-saturated T2-weighted (TR, 4067 ms; TE, 88 ms) (upper middle) fast spin echo (FSE) MR images acquired at two fixed echo times as well as four MR images with variable T2-weighted image contrast generated using the synthetic-TE method described above (upper right, TE=0 ms; lower left, TE=6 ms, lower middle, TE=30 ms; lower right, TE=60 ms).

As described above, the reliability of the synthesized images depend on how well the actual MR signal fits the assumed decay model. To address this issue, the quality of every mono-exponential fit was assessed through a $\chi^2$ calculation. In this example, a user-selectable p-value threshold was provided. Pixels falling below the threshold were identified by a red color overlay superimposed onto the synthetic-TE image.

FIG. 4 shows an example of the user interface provided for detection of poor-quality fits to the decay model. The user interface provides the user with an option to interactively and dynamically set a p-value threshold for the synthetic image. Pixels with p-values below the selected p-value threshold are determined to not fit the assumed decay model. FIG. 4 shows five different synthetic images generated for different p-value thresholds ranging from 0.05 to 1. Pixels falling below the user-selected p-value threshold were identified by a red color overlay superimposed onto the synthetic-TE image.

In this example, the user was provided with the option to interactively and dynamically adjust the p-value threshold during image analysis, however in other examples, the p-value threshold may be pre-set and fixed, either by the user or pre-set in the system. A dynamically user-selectable p-value threshold may be useful because this may allow the user to interpret for himself the reliability of the information depicted in the image, additionally allowing the user to incorporate his experience and judgment into the ultimate clinical decision. Moreover, the precise p-value threshold for optimal clinical decision making (if one exists) may be unknown.

Evaluation of MR Images

During a first image reading session, two sub-speciality trained radiologists who were blinded to the clinical and surgical results, evaluated the sagittal intermediate-weighted and fat-saturated T2-weighted FSE MR images with regard to abnormalities of the menisci, articular cartilage, and—as an adjunct—cruciate ligaments using a PACS image viewer software (in this example, a software from Clear Canvas Inc.).

During a second image reading session which was separated from the first reading session by a 4 week-interval, both radiologists evaluated the menisci, articular cartilage, and cruciate ligaments again, now only using synthetic-TE MR images. Both reviewers were asked to use all features of the synthetic image user interface implemented in the PACS software, including the option to dynamically vary the image echo times, as well as superimposing dynamically variable p-value threshold overlay maps. To facilitate a fair comparison between standard and synthetic image methods, only the sagittal MR images from the standard knee MR imaging protocol were evaluated and compared to the sagittal synthetic MR images.

Menisci and articular cartilage were both assessed based on the Whole-Organ MR Imaging Score (WORMS) classification system (reference 25). The cruciate ligaments were judged to be "intact" or "torn".

Surgery as Reference Standard

Four of the 24 patients in whom MR imaging was performed for the purpose of this study, decided not to proceed to arthroscopic surgery following their MR imaging examination. These patients were treated conservatively elsewhere. Since all MR images were analyzed after the individual patients' decisions, these decisions were independent of the MR imaging results. Thus, 12-100 days (mean/median, 41.3/36.0 days) after MR imaging, knee arthroscopy (8/12 left/right knees) was performed in twenty patients (2 women, 18 men; mean/median age, 44.7/45.1 years; age range 18-67 years) by one single orthopaedic surgeon who was blinded to the all MR imaging findings and who had no access to the images. Intra-operative assessment of the menisci, articular cartilage, and cruciate ligaments was performed using the same classification system as used by the radiologists. The only difference in the surgical grading system was that intra-operative detected softening of the articular cartilage with an intact surface was defined as grade 1. The worst pathology in each anatomic region was recorded at surgical evaluation.

Statistical Analyses

The intra-class correlation coefficient (ICC) was calculated to evaluate the inter-method agreement between the standard and synthesized MR images (based on the WORMS classification system). The ICC was also calculated for the agreement between both MR imaging techniques and surgery. According to Landis and Koch, an ICC of 0.61-0.80 was considered to be indicative for a "substantial" agreement, and an ICC greater than 0.80 for an "almost perfect" agreement (ICC=1.0, "perfect" agreement) (references 26, 27). P-values were calculated using t-tests to indicate statistical significance of ICCs being different from zero ($\alpha<0.05$).

To facilitate the evaluation of the diagnostic performance for MR imaging, data of those 20 subjects who underwent surgery were dichotomized into "normal" and "abnormal"; for meniscus abnormalities the cutoff was set between grade 0 and grades 1 to 4 (regional analysis) or score 0 and score 1 to 6 (overall analysis); for articular cartilage abnormalities the cutoff was set between grades 0 and 1 (intact cartilage surface) and grades 2 to 6 (cartilage surface defects). Sensitivity, specificity, accuracy, positive and negative predictive values with corresponding 95% confidence intervals were calculated for the detection of meniscal, articular cartilage, and cruciate ligament abnormalities (reference 28), and compared using sign tests.

Results

Agreement Between Standard and Synthesized MR Images

The overall inter-method agreement between the standard and synthesized MR images was "almost perfect" (ICC=0.86; see Table 2 in FIG. 8). The inter-method agreement with regard to the assessment of meniscal and cartilage abnormalities, as well as with regard to cruciate ligament tears was "almost perfect" to "perfect" (ICC values ranging from 0.80 to 1.0).

Agreement Between MR Imaging and Surgery

Both standard and synthesized MR images showed a "substantial" to "perfect" agreement with surgery with regard to meniscal, cartilage, and cruciate ligament abnormalities (see Table 3 in FIG. 9). The agreement between the imaging and arthroscopic findings was slightly better for meniscal tears (ICC range, 0.86-0.97) than for articular cartilage abnormalities (ICC range, 0.79-0.80).

Diagnostic Performance

Overall, the diagnostic performance of standard MR imaging and the synthetic-TE technique for the detection of meniscal and articular cartilage lesions was not statistically different (p=0.5-1.0).

In total, 12 medial and 5 lateral meniscal tears were seen at surgery. For both standard MR imaging and the synthetic-TE analysis, sensitivities and specificities for the detection of meniscal tears were almost identical (see Table 4 in FIG. 10) when the different subregions (anterior horn, body, and/or posterior horn) of the menisci were evaluated.

FIG. 5 shows an example of a sagittal intermediate-weighted (TR/TE, 2000/17 ms) (top) image and a fat-saturated T2-weighted (TR/TE, 4067/88 ms) (middle) FSE MR image, as well as of a synthesized MR image (synthetic TE=5.25 ms) (bottom) of the knee of a 61 year old male subject. The images show an area of increased signal intensity within the posterior horn of the lateral meniscus, most remarkable on the intermediate-weighted MR image (top, white arrow). The synthetic-TE image (bottom) shows that this area of increased signal intensity reaches the undersurface of the meniscus. At surgery, a meniscal tear was confirmed.

Sensitivities with regard to the overall meniscus score were slightly higher for standard MR imaging (100% and 100% for the medial and lateral meniscus) when compared to the synthetic-TE technique (92% and 100%, respectively). However, these differences were not statistically significant (p=0.5). Similar findings were seen for specificities which were almost identical for standard and synthesized MR images (88% and 93% versus 88% and 87%, for the medial and lateral meniscus respectively). Overall accuracies for the detection of meniscal tears were greater than 90% for both techniques (see Table 4 in FIG. 10).

In total, 33 abnormalities of the articular cartilage were seen in the 12 different subregions at surgery. Overall sensitivities and specificities for the detection of these articular cartilage lesions were 70% and 99% for the synthetic-TE technique, and 82% and 97% for standard MR images, respectively. Results for the individual subregions of articular cartilage are summarized in FIG. 6. The articular cartilage surface was divided into 12 subregions according to the Whole-Organ MR Imaging Score (WORMS) classification system. The diagnostic performance of standard MR imaging and the synthetic-TE technique for the detection of articular cartilage abnormalities in each subregion is shown (NA=not available).

Surgery confirmed three anterior cruciate ligaments tears seen at standard and synthesized MR images (no false positive or negative findings). There were no tears of the posterior cruciate ligament. Due to the low incidence of cruciate ligament tears, no formal calculation of sensitivities and specificities was performed.

Thus, the sensitivity and specificity for the detection of medial/lateral meniscal tears using the synthetic-TE technique was found to be similar to the values obtained using a conventional MR imaging protocol. These results demonstrate the useability of the synthetic image generation method and the user interface for interactive and dynamic user-selection of synthetic image generation parameters. By comparison, a meta-analysis of articles published between 1991 and 2000 found pooled sensitivities and specificities of 93% and 88% for medial, and 79% and 95% for lateral meniscal tears (reference 29).

Applications

The method, system and user interface for synthetic image generation may provide retrospective user-selectable real-time variation of a synthetic image, for example based on MR acquisition parameters such as TE and quality thresholds such as a p-value threshold. The user interface may be integrated into conventional image processing systems. The example study shows that abnormalities of the meniscus and articular cartilage may be assessed with high sensitivity and high specificity using synthetic-TE MR images.

The method, system and user interface for synthetic image generation may provide for a way to dynamically adjust a synthetic image through a continuum of any suitable MR acquisition parameters, such as TE and TI values. This may allow for the evaluation of MR images throughout a continuous range of user-selectable values for a MR acquisition parameter, thus allowing for increased user image review options in MR imaging. Thus, the user is provided with a way to dynamically adjust the synthetic image being viewed, through a continuum of values for a MR acquisition parameter, such as TE and TI values, facilitating the use of synthetic images on a routine basis. For example, this may be useful for imaging of the knee, providing the potential for improved diagnostic accuracy in evaluation of internal derangement of the joint.

Another example is the use of synthetic images for meniscal MR imaging. Standard meniscal MR imaging is typically characterized by low signal intensity due to the short meniscal T2 values. This low-signal intensity appearance has influenced present definitions of meniscal abnormalities, such as meniscal tears, which are typically defined as areas of increased signal that reach the meniscal surface (reference 29). The synthetic-TE image generation method disclosed may provide additional diagnostic information at the lower TE range in the form of direct, high signal intensity visualization of the menisci. For example, in the example study described above, signals within the meniscus at very short synthetic TEs could be observed. Other studies using ultra-short echo-time (UTE) imaging have already begun to use this information for the visualization and differentiation of the vascular (red) and avascular (white) zones of menisci (references 19, 23, 30).

The use of synthesized T2-weighted MR images with retrospective user-selectable variation of the image echo time could change the assessment of articular cartilage. In standard assessments, diagnostic information is derived from an evaluation of cartilage thickness and surface integrity. Previous developments in MR pulse sequences have mainly focused on improving the image contrast of articular cartilage relative to the surrounding joint fluid at a single prescribed TE setting (references 31, 32). However, beneath an intact articular cartilage surface, abnormalities such as loss of proteogylcans, with or without damage to its typical multi-zonal collagen ultrastructure, can be found (references 33, 34). At surgery, such areas are typically described as "softened" or "swollen" (reference 35). However, internal abnormalities of articular cartilage are typically difficult to visualize on standard MR images. This is due to the fact that in normal cartilage, a gradient in T2 values from approximately 30 to 60 ms exists from the subchondral to articular surface (reference 18). This T2 gradient makes it difficult to select a single optimal TE value for evaluation of articvalar cartilage. The synthetic-TE image technique on the other hand, allows for a retrospective dynamic real-time user adjustment of the echo times. Therefore, potentially, an optimal evaluation of the individual zones of articular cartilage from the calcified bone-cartilage interface to the superficial zone, as well as variations in inherent T2 characteristics of hyaline articular cartilage is possible.

The synthetic image generation technique also might allow a reliable assessment of other low-signal intensity structures, particularly in the knee, such the cruciate ligaments. In the example study, all anterior cruciate ligament tears were correctly detected on both standard and synthetic-TE sagittal MR images. However, due to the low incidence of cruciate ligament tears in our study, final conclusions cannot be drawn. However, as with menisci, the synthetic-TE technique may provide additional diagnostic information at the lower TE range in the form of direct, high signal intensity visualization of anatomical structures.

In some examples, the disclosed method, system and user interface may be suitable for the assessment of myocardial delayed enhancement images. In an example of this application, contrast agent is injected into a patient. After a variable period of time, a series of T1-weighted images are acquired. The T1-weighting is governed by the parameter TI. In theory, the aim is to choose the TI parameter such that the signal from normal myocardium is nulled, whilst signal from infracted regions is not. In practice, it may be difficult and time consuming to identify the optimal TI that maximizes the contrast between normal and infracted myocardium. This difficulty may be due to several reasons. One reason is that the amount of elapsed time between contrast injection and images may be variable. In turn, this affects the amount of contrast agent, and thus signal in the heart. Another reason is that biologic variability affects the amount of contrast agent entering the heart. Another reason is that the precise amount of T1 contrast may be sensitive to the TI chosen. Generation of synthetic images for different TI values may be useful. For a synthetic-TI image in this example, T1 map (in this example, of the myocardium) may be acquired. Using the synthetic image method described above, applied to TI, a certain TI value may be achieved retrospectively.

In some embodiments, the method includes the option of assessing the reliability of the synthetic image using a quality threshold, such as $\chi^2$ or p-value thresholds. This additional information may provide for improved diagnostic reliability over existing synthetic image approaches. This same approach may be extended to include other response models, for example non-mono-exponential models of signal decay for a synthetic-TE image. Even in locations where synthetic image information is unreliable (e.g., as determined due to low p-values), diagnostic information is still available by referring back to the underlying acquired data, for example T2-weighted source images from which the T2 maps were generated, in the case of a synthetic-TE image. Thus, even in the worst-case scenario where unreliable fits exist in an area of suspected pathology, the information available from a conventional MR acquisition is accessible.

As described above, the synthetic-TE imaging technique allows the echo time to be set to zero. At first glance, this may appear to provide similar information to ultra-short TE (UTE) imaging without the necessity for strong gradients, fast switching transmit-receive coils, or specialized pulse sequences (reference 23). In reality, this is not necessarily the case. The ability of synthetic-TE imaging to visualize anatomy with a particular T2 value is limited by the signal-to-noise ratio. For example, if the anatomy possesses a T2 value that is so short that it decays to the noise level before the first echo, it would not be visualized even with a synthesized TE of zero. UTE imaging may be used for such anatomy. Synthetic images may also be generated based on UTE image data, using the same technique described above. Thus, a synthetic-TE approach could in fact be combined with UTE MR imaging to optimize the contrast between structures with very short T2 values.

Although the above examples describe the generation of synthetic-TE images, synthetic images may be generated for other MR acquisition parameters, including, for example, TI, gradient strength or b-value. The above examples describe the use of T2 and PD values for generating synthetic images, however other response values of particular tissue properties may be used to generate synthetic images, including, but not limited to, response values such as T1 and diffusion time. For different response values, different property response models may be used, including, for example, a decay model and a recovery model.

While the present disclosure refers to particular imaging techniques and systems, modifications are possible, and the present disclosure is not limited to the specific details described in the examples. The present disclosure may equally be applicable to other imaging techniques and imaging systems. Although the present disclosure refers to imaging of the knee joint, the disclosed method and system may be used for imaging of any other suitable target, including non-human targets.

Although the present disclosure describes methods and user interfaces, a person of ordinary skill in the art will understand that the present disclosure is also directed to systems for implementing the disclosed methods and user interfaces and including components for implementing the disclosed methods and user interfaces, be it by way of, for example, hardware components, a processor executing computer-executable instructions to enable the practice of the disclosed methods and user interfaces, by any combination of the two, or in any other manner. Moreover, computer program products for use with the system, such as a pre-recorded storage device or other similar computer-readable medium including computer-executable instructions tangibly recorded thereon, or a computer data signal carrying computer readable program instructions may direct a system to facilitate the implementation of the disclosed methods and user interfaces. It is understood that such systems, computer program products, and computer data signals also come within the scope of the present disclosure.

The embodiments of the present disclosure described above are intended to be examples only. Alterations, modifications and variations may be made without departing from the intended scope of the present disclosure. In particular, selected features and ranges from one or more of the above-described embodiments may be combined to create alternative embodiments not explicitly described. The subject matter described herein intends to cover and embrace all suitable changes in technology. All references mentioned are hereby incorporated by reference in their entirety.

References

1. Rauscher I, Stahl R, Cheng J, et al. Meniscal measurements of T1rho and T2 at MR imaging in healthy subjects and patients with osteoarthritis. Radiology 2008; 249:591-600.

2. Smith H E, Mosher T J, Dardzinski B J, et al. Spatial variation in cartilage T2 of the knee. J Magn Reson Imaging 2001; 14:50-55.

3. Vidarsson L, Gold G E, Hargreaves B, Pauly J M. Linear combination filtering for T2-selective imaging of the knee. Magn Reson Med 2006; 55:1191-1196.

4. Mosher T J, Dardzinski B J, Smith M B. Human articular cartilage: influence of aging and early symptomatic degeneration on the spatial variation of T2—preliminary findings at 3 T. Radiology 2000; 214:259-266.

5. Bottomley P A, Foster T H, Argersinger R E, Pfeifer L M. A review of normal tissue hydrogen NMR relaxation times and relaxation mechanisms from 1-100 MHz: dependence on tissue type, NMR frequency, temperature, species, excision, and age. Med Phys 1984; 11:425-448.

6. Bottomley P A, Hardy C J, Argersinger R E, Allen-Moore G. A review of 1H nuclear magnetic resonance relaxation in pathology: are T1 and T2 diagnostic? Med Phys 1987; 14:1-37.

7. Riederer S J, Suddarth S A, Bobman S A, Lee J N, Wang H Z, MacFall J R. Automated MR image synthesis: feasibility studies. Radiology 1984; 153:203-206.

8. Riederer S J, Lee J N, Farzaneh F, Wang H Z, Wright R C. Magnetic resonance image synthesis. Clinical implementation. Acta Radiol Suppl 1986; 369:466-468.

9. Riederer S J, Bobman S A, Lee J N, Farzaneh F, Wang H Z. Improved precision in calculated Ti MR images using multiple spin-echo acquisition. J Comput Assist Tomogr 1986; 10:103-110.

10. Lee J N, Riederer S J, Bobman S A, Johnson J P, Farzaneh F. The precision of TR extrapolation in magnetic resonance image synthesis. Med Phys 1986; 13:170-176.

11. Lee J N, Riederer S J, Bobman S A, Farzaneh F, Wang H Z. Instrumentation for rapid MR image synthesis. Magn Reson Med 1986; 3:33-43.

12. Bobman S A, Riederer S J, Lee J N, Tasciyan T, Farzaneh F, Wang H Z. Pulse sequence extrapolation with MR image synthesis. Radiology 1986; 159:253-258.

13. Bobman S A, Riederer S J, Lee J N, Suddarth S A, Wang H Z, MacFall J R. Synthesized MR images: comparison with acquired images. Radiology 1985; 155:731-738.

14. Lee J N, Riederer S J. The contrast-to-noise in relaxation time, synthetic, and weighted-sum MR images. Magn Reson Med 1987; 5:13-22.

15. Kuhn M H, Menhardt W, Carlsen I C. Real-time interactive NMR image synthesis. IEEE Trans Med Imaging 1985; 4:160-164.

16. Feinberg D A, Mills C M, Posin J P, et al. Multiple spin-echo magnetic resonance imaging. Radiology 1985; 155:437-442.

17. Deoni S C, Rutt B K, Peters T M. Synthetic T1-weighted brain image generation with incorporated coil intensity correction using DESPOT1. Magn Reson Imaging 2006; 24:1241-1248.

18. White L M, Sussman M S, Hurtig M, Probyn L, Tomlinson G, Kandel R. Cartilage T2 assessment: differentiation of normal hyaline cartilage and reparative tissue after arthroscopic cartilage repair in equine subjects. Radiology 2006; 241:407-414.

19. Gatehouse P D, He T, Puri B K, Thomas R D, Resnick D, Bydder G M. Contrast-enhanced MRI of the menisci of the knee using ultrashort echo time (UTE) pulse sequences: imaging of the red and white zones. Br J Radiol 2004; 77:641-647.

20. Deoni S C, Rutt B K, Peters T M. Rapid combined T1 and T2 mapping using gradient recalled acquisition in the steady state. Magn Reson Med 2003; 49:515-526.

21. Busse R F. Reduced RF power without blurring: correcting for modulation of refocusing flip angle in FSE sequences. Magn Reson Med 2004; 51:1031-1037.

22. Schaefer D J. Dosimetry and effects of MR exposure to RF and switched magnetic fields. Ann N Y Acad Sci 1992; 649:225-236.

23. Gatehouse P D, Thomas R W, Robson M D, Hamilton G, Herlihy A H, Bydder G M. Magnetic resonance imaging of the knee with ultrashort TE pulse sequences. Magn Reson Imaging 2004; 22:1061-1067.

24. MacFall J R, Riederer S J, Wang H Z. An analysis of noise propagation in computed T2, pseudodensity, and synthetic spin-echo images. Med Phys 1986; 13:285-292.

25. Peterfy C G, Guermazi A, Zaim S, et al. Whole-Organ Magnetic Resonance Imaging Score (WORMS) of the knee in osteoarthritis. Osteoarthritis Cartilage 2004; 12:177-190.

26. Kundel H L, Polansky M. Measurement of Observer Agreement. Radiology 2003; 228:303-308.

27. Landis J R, Koch G G. The measurement of observer agreement for categorical data. Biometrics 1977; 33:159-174.

28. Newcombe R G. Two-sided confidence intervals for the single proportion: comparison of seven methods. Stat Med 1998; 17:857-872.

29. Fox MG. MR imaging of the meniscus: review, current trends, and clinical implications. Radiologic Clinics of North America 2007; 45: 1033-1053.

30. Gatehouse P D, Bydder G M. Magnetic resonance imaging of short T2 components in tissue. Clin Radiol 2003; 58:1-19.

31. Gold G E, Busse R F, Beehler C, et al. Isotropic MRI of the knee with 3D fast spin-echo extended echo-train acquisition (XETA): initial experience. AJR Am J Roentgenol 2007; 188:1287-1293.

32. Schmid M R, Pfirrmann C W, Koch P, Zanetti M, Kuehn B, Hodler J. Imaging of patellar cartilage with a 2D multiple-echo data image combination sequence. AJR Am J Roentgenol 2005; 184:1744-1748.

33. Buckwalter J A, Mankin H J. Articular cartilage: degeneration and osteoarthritis, repair, regeneration, and transplantation. Instr Course Lect 1998; 47:487-504.

34. Link T M, Stahl R, Woertler K. Cartilage imaging: motivation, techniques, current and future significance. Eur Radiol 2007; 17:1135-1146.

35. Kleemann R U, Krocker D, Cedraro A, Tuischer J, Duda G N. Altered cartilage mechanics and histology in knee osteoarthritis: relation to clinical assessment (ICRS Grade). Osteoarthritis Cartilage 2005; 13:958-963.

36. Duc S R, Koch P, Schmid M R, Horger W, Hodler J, Pfirrmann C W. Diagnosis of articular cartilage abnormalities of the knee: prospective clinical evaluation of a 3D water-excitation true FISP sequence. Radiology 2007; 243:475-482.

37. Duc S R, Pfirrmann C W, Schmid M R, et al. Articular cartilage defects detected with 3D water-excitation true FISP: prospective comparison with sequences commonly used for knee imaging. Radiology 2007; 245:216-223.

38. Jungius K P, Schmid M R, Zanetti M, Hodler J, Koch P, Pfirrmann C W. Cartilaginous defects of the femorotibial joint: accuracy of coronal short inversion time inversion-recovery MR sequence. Radiology 2006; 240:482-488.

The invention claimed is:

1. A method of synthetic image generation for magnetic resonance (MR) imaging, the method comprising:
receiving a plurality of MR imaging data sets, each data set comprising a set of pixel values acquired at a different value for at least one MR acquisition parameter; determining a response value for a particular property of tissues for each pixel, based on a calculated fit of each pixel to a property response model; generating a synthetic image for a selected value of the at least one MR acquisition parameter, based on the determined response value for each pixel; providing an option to dynamically change the selected value of the at least one MR acquisition parameter; and in response to any change in the selected value of the at least one MR acquisition parameter, re-generating the synthetic image; wherein the at least one MR acquisition parameter is echo time (TE) or inversion time (TI);
wherein if the MR acquisition parameter is TE, the response value is T2 and proton density (PD), and the property response model is a decay model; and
wherein if the MR acquisition parameter is TI, the response value is T1, and the property response model is a recovery model.

2. The method of claim 1 wherein the decay model is a mono-exponential decay model.

3. The method of claim 1 wherein a selected TE is dynamically-selectable in a range from 0 ms to infinity.

4. The method of claim 1 further comprising:
providing an option to select a quality threshold for the synthetic image;
determining any pixel in the synthetic image that fails to meet the quality threshold; and
indicating the determined pixels that fail to meet the quality threshold.

5. The method of claim 4, wherein the quality threshold is dynamically-selectable.

6. The method of claim 4 wherein the quality threshold is a $\chi^2$ value threshold or a p-value threshold.

7. A system for synthetic image generation for magnetic resonance (MR) imaging, the system comprising a processor configured to execute computer-executable instructions to cause the system to:
receive a plurality of MR imaging data sets, each data set comprising a set of pixel values acquired at a different value for at least one MR acquisition parameter;
determine a response value for a particular property of tissues for each pixel, based on a calculated fit of each pixel to a property response model;
generate a synthetic image for a selected value of the at least one MR acquisition parameter, based on the determined response value for each pixel;
provide an option to dynamically change the selected value of the at least one MR acquisition parameter; and
in response to any change in the selected value of the at least one MR acquisition parameter, re-generate the synthetic image;
wherein the at least one MR acquisition parameter is echo time (TE) or inversion time (TI);
wherein if the MR acquisition parameter is TE, the response value is T2 and proton density (PD), and the property response model is a decay model; and
wherein if the MR acquisition parameter is TI, the response value is T1, and the property response model is a recovery model.

8. The system of claim 7 wherein the system is a MR image processing workstation.

9. The system of claim 7 wherein the system is a picture archiving and communication system (PACS).

10. The system of claim 7, wherein the computer-executable instructions further cause the processor to implement a graphical user interface (GUI) comprising:
an image portion for displaying the synthetic image; and
a selectable option to dynamically change the selected value of the at least one MR acquisition parameter.

11. The system of claim 7 wherein the GUI further comprises a selectable option to select a quality threshold for the synthetic image.

* * * * *